US011893484B2

(12) United States Patent
Oskooi et al.

(10) Patent No.: US 11,893,484 B2
(45) Date of Patent: Feb. 6, 2024

(54) SYSTEM AND METHOD FOR EFFICIENT PARALLEL EXECUTION OF PHYSICAL SIMULATIONS

(71) Applicant: X Development LLC, Mountain View, CA (US)

(72) Inventors: Ardavan Oskooi, Mill Valley, CA (US); Christopher Hogan, Champaign, IL (US); Alec M. Hammond, Atlanta, GA (US); Steven G. Johnson, Arlington, MA (US)

(73) Assignee: X Development LLC, Mountain View, CA (US)

( * ) Notice: Subject to any disclaimer, the term of this patent is extended or adjusted under 35 U.S.C. 154(b) by 672 days.

(21) Appl. No.: 17/111,364

(22) Filed: Dec. 3, 2020

(65) Prior Publication Data

US 2021/0174206 A1    Jun. 10, 2021

Related U.S. Application Data

(60) Provisional application No. 62/944,622, filed on Dec. 6, 2019.

(51) Int. Cl.
*G06F 30/20* (2020.01)
*G06N 3/08* (2023.01)
*G06N 3/045* (2023.01)

(52) U.S. Cl.
CPC .............. *G06N 3/08* (2013.01); *G06F 30/20* (2020.01); *G06N 3/045* (2023.01)

(58) Field of Classification Search
CPC .......... G06N 3/08; G06N 3/045; G06N 3/048; G06N 3/084; G06F 30/20; G06F 9/5066; G06F 2209/5019; G06F 30/27
See application file for complete search history.

(56) References Cited

U.S. PATENT DOCUMENTS

| 2003/0191615 A1 | 10/2003 | Bailey et al. |
| 2005/0010883 A1 | 1/2005 | Wood |
| 2009/0132216 A1 | 5/2009 | Grichnik et al. |
| 2013/0110490 A1* | 5/2013 | Letz ........................ G06F 30/33 |
| | | 703/21 |

(Continued)

OTHER PUBLICATIONS

Li et al., Power-aware MPI Task Aggregation Prediction for High-End Computing Systems, May 31, 2010, Research Gate.

(Continued)

*Primary Examiner* — Hassan Mrabi
(74) *Attorney, Agent, or Firm* — Christensen O'Connor Johnson Kindness PLLC

(57) ABSTRACT

In some embodiments, a method for optimal parallel execution of a simulation of a design is provided. A computing device extracts one or more features from the design. The computing device provides at least the one or more features as inputs to one or more machine learning models to determine one or more predictions of execution times. The computing device determines an optimum execution architecture based on the one or more predictions of execution times. The computing device distributes portions of the design for simulation based on the optimum execution architecture. In some embodiments, one or more machine learning models are trained to generate outputs for predicting an optimal parallel execution architecture for simulation of a design.

20 Claims, 13 Drawing Sheets

(56) References Cited

U.S. PATENT DOCUMENTS

| | | |
|---|---|---|
| 2017/0213131 A1* | 7/2017 | Hammond ............. G06N 3/045 |
| 2018/0173827 A1 | 6/2018 | Boulkenafed et al. |
| 2019/0042389 A1 | 2/2019 | Kobayashi |
| 2021/0174206 A1* | 6/2021 | Oskooi ................. G06N 3/045 |

OTHER PUBLICATIONS

International Search Report and Written Opinion, dated Apr. 7, 2021, in corresponding International Patent Application No. PCT/US2020/063354, 10 pages.

Gupta, A., et al., "Performance Properties of Large Scale Parallel Systems", Journal of Parallel Distributed Computing, Oct. 1993, pp. 1-21.

Hieu, D. N., et al., "A Machine Learning-Based Approach for Predicting the Execution Time of CFD Applications on Cloud Computing Environment", Conference Paper in Lecture Notes in Computer Science, Nov. 2016, 14 pages.

Matheson, L. R., et al., "A Critical Analysis of Multigrid Methods on Massively Parallel Computers", Jul. 21, 1993, pp. 1-19.

Oskooi, A. F. et al. "Meep: A flexible free-software package for electromagnetic simulations by the FDTD method." Computer Physics Communications 181.3 (2010): 687-702, 30 pages.

Rodriquez, D., et al., "Massively Parallel Solution of the BIGlogal Eigenvalue Problem Using Dense Linear Algegra," AIAA Journal, vol. 47, No. 10, Oct. 2009.

Witbrock, M., et al., "An Implementation of Back-Propagation Learning on GF11, a Large SIMID Parallel Computer", School of Computer Science, Carnegie Mellon University, Pittsburgh, PA, Dec. 1989, 28 pages.

Wolf, F., et al., "Catwalk: A Quick Development Path for Performance Models", Euro-Par 2014 Workshops, Part II, LNCS 8806, 2014, pp. 589-600.

* cited by examiner

SYSTEM AND METHOD FOR EFFICIENT PARALLEL EXECUTION OF PHYSICAL SIMULATIONS

CROSS-REFERENCE TO RELATED APPLICATIONS

This application claims the benefit of Provisional Application No. 62/944,622, filed Dec. 6, 2019, the entire disclosure of which is hereby incorporated by reference herein for all purposes.

TECHNICAL FIELD

This disclosure relates generally to parallel computing, and in particular but not exclusively, relates to parallel processing of physical simulations.

BACKGROUND

Large-scale, parallel physics simulations used for science and engineering typically require significant hardware resources due at least in part to memory-intensive workloads. The shared memory available on a single machine (e.g., a standalone desktop workstation, a single remote server, etc.) is often inadequate for most practical simulations. As a result, simulations are often parallelized using a distributed-memory framework based on the standard message passing interface (MPI) in order to enable their execution using clusters of interconnected processing elements (i.e., supercomputers, privately owned clusters, virtual clusters in cloud computing systems, etc).

One of the main challenges to the efficient execution of parallelized simulations using MPI clusters is determining a priori the optimal number of processing elements (or, similarly, the total number of processors) which provides the maximum speedup (i.e., the improvement in the running time as measured e.g. in seconds relative to the serial or single processor case). Because of Amdahl's law, the speedup due to parallelization has a characteristic profile: for each simulation, there exists a maximum speedup which is constrained by those computational elements of the simulation that do not benefit from parallelization. The fewest number of processing elements necessary to attain maximum speedup represents the optimal cluster configuration. For any given simulation, the optimal cluster configuration is different because of each simulation's unique computational profile. Inefficient use of cluster resources, whereby not all allocated processing elements are utilized close to their maximum extent throughout the entire running time of the simulation, can be costly particularly when executing simulations using the public cloud or other computing hardware in which on-demand virtual instances are rented by the hour.

There is a rich literature of previous work on predicting execution times of scientific computations. Considerable effort has been expended in developing "analytical" models that predict code performance based on low-level hardware details (e.g. memory bandwidth, etc.) combined with fine-grained (often compiler-assisted) software instrumentation. Such analyses are challenging to apply to large, evolving codebases. Many authors have also proposed automated performance analyses, either based on polynomial fits or artificial neural networks (ANNs). However, none of this work considered spatial heterogeneity, and the simulations were typically characterized only by the size of the grid (amount of data) and the number of processing elements. Some authors considered homogeneous calculations across heterogeneous computing hardware, which effectively adds one or two additional inputs to the NN.

BRIEF SUMMARY

In some embodiments, a non-transitory computer-readable medium is provided. The computer-readable medium has logic stored thereon that, in response to execution by one or more processors of a computing device, cause the computing device to perform actions for optimal parallel execution of a simulation of a design, the actions include extracting, by the computing device, one or more features from the design; providing, by the computing device, at least the one or more features as inputs to one or more machine learning models to determine one or more predictions of execution times; determining, by the computing device, an optimum execution architecture based on the one or more predictions of execution times; and distributing, by the computing device, portions of the design for simulation based on the optimum execution architecture.

In some embodiments, a method for optimal parallel execution of a simulation of a design is provided. A computing device extracts one or more features from the design. The computing device provides at least the one or more features as inputs to one or more machine learning models to determine one or more predictions of execution times. The computing device determines an optimum execution architecture based on the one or more predictions of execution times. The computing device distributes portions of the design for simulation based on the optimum execution architecture.

In some embodiments, a non-transitory computer-readable medium is provided. The computer-readable medium has logic stored thereon that, in response to execution by one or more processors of a computing device, cause the computing device to perform actions for training a machine learning model to generate outputs for predicting an optimal parallel execution architecture for simulation of a design, the actions include determining, by the computing device, a set of sample designs; causing, by the computing device, each sample design to be simulated using at least one hardware configuration; determining, by the computing device, a set of features for each simulation, where the set of features for each simulation includes a number of segment types of the sample design in the simulation, a total number of segments of the sample design in the simulation, and a characteristic of the hardware configuration of the simulation; training, by the computing device, at least one machine learning model using the features for each simulation and the measured performance of each simulation as training data; and storing, by the computing device, the at least one machine learning model in a model data store.

BRIEF DESCRIPTION OF THE SEVERAL VIEWS OF THE DRAWINGS

Non-limiting and non-exhaustive embodiments of the invention are described with reference to the following figures, wherein like reference numerals refer to like parts throughout the various views unless otherwise specified. Not all instances of an element are necessarily labeled so as not to clutter the drawings where appropriate. The drawings are not necessarily to scale, emphasis instead being placed upon illustrating the principles being described. To easily identify the discussion of any particular element or act, the most significant digit or digits in a reference number refer to the figure number in which that element is first introduced.

DETAILED DESCRIPTION

Figure 1:
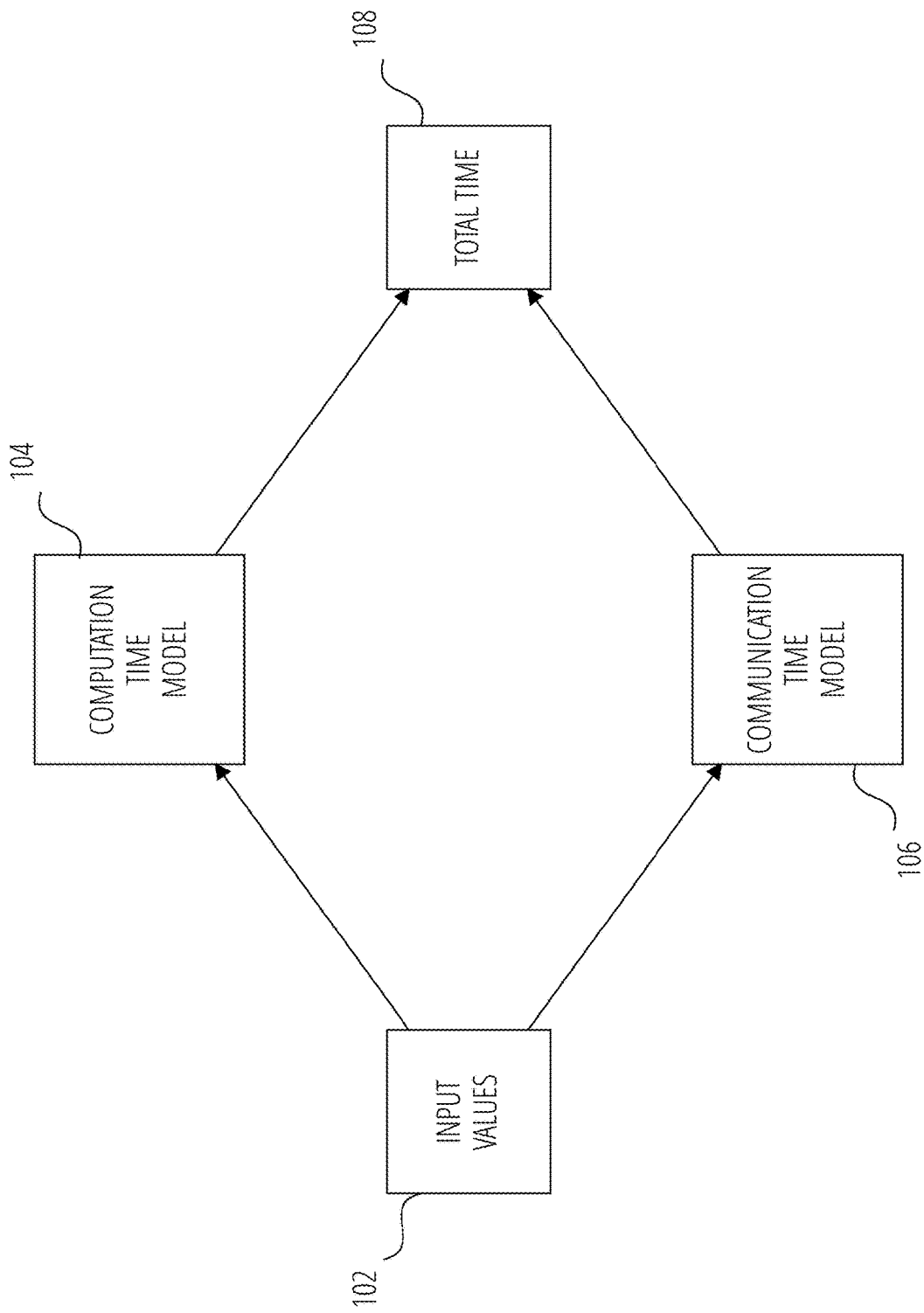
FIG. 1 is a schematic drawing that illustrates a non-limiting example embodiment of a machine learning architecture that may be used to predict simulation times according to various aspects of the present disclosure.

One factor used for predicting the optimum execution architecture for a simulation of a given design is to have a rough estimate of its execution time in advance for a given compute platform. Ideally, this estimation should be automated using machine learning. However, predicting execution time for the physical simulations used in computer-aided engineering (CAE) do not have the luxury of existing big datasets that are available in other areas of machine learning. Collecting empirical data for such an estimate involves massively parallel computations, which must be re-run for each new hardware platform. Accordingly, one would like to construct accurate estimates from as little training data as possible. "Analytical" performance estimates from detailed hardware models and fine-grained code instrumentation are possible in controlled settings, but it is difficult to apply that approach to large codebases with many features undergoing continual development.

Herein are presented techniques for performance prediction of realistic physical simulations (including but not limited to FDTD electrodynamics simulations in heterogeneous materials), using machine learning techniques applied to a factored form of the execution time that allows training the network using a relatively small number of execution measurements. Some embodiments of the present disclosure exploit crude a priori knowledge of the scaling characteristics of load-balanced simulations to achieve these goals.

Whereas previous works on performance prediction using artificial neural networks (ANNs) and other methods often attacked simple model problems in which identical computations occur everywhere in a uniform computational mesh or dataset divided equally among processing elements, some embodiments of the present disclosure address a more realistic practical situation of heterogeneous physics: different phenomena or calculations are modeled at different points in the computational domain. Different materials or data processing will often require vastly disparate computational resources, and merely dividing such a domain into equal-volume chunks for each processing element can result in an imbalanced computational load, such that some processing elements are idle while others complete their work. This both degrades performance and makes performance prediction more difficult since it depends on the precise spatial layout. Hence, some embodiments of the present disclosure also apply a data-driven approach to load balancing, in which a small number of simulations are used to estimate the costs of different model components, leading to a new partitioning algorithm that produces unequal domains as appropriate with nearly equal costs per process. This heterogeneity may also be an input to the ANN, and despite the complexity of such unequal-chunk parallel computations it is possible to predict the execution time of simulations drawn from real applications with a mean error of around 20±10% on Amazon EC2 cloud-computing clusters. Load balancing allows the ANN to predict execution based on what kinds of physics are present but without needing to know the exact spatial distribution, enabling a 6-input ANN to be trained with ~104 simulations. This is achieved for a popular free/open-source physics package with a complicated C++ codebase (200,000+ lines) and a huge Python-scripted feature set, using minimal code modifications, making it likely that similar techniques could be applied to other practical simulation software.

Massively parallel scientific simulations provide only a limited amount of training data for predicting running time. As the number n of inputs (of the simulation or the hardware) is increased, a larger and larger set of training data is generally used for an ANN to fully characterize the problem space. However, acquiring training data is costly in this case, since each data point is a large-scale parallel simulation. In order to reduce the amount of training runs required to obtain accurate predictions for heterogeneity with many inputs $\vec{p} \in \mathbb{R}^n$, the execution time T(p) is factorized to exploit crude a priori knowledge. First, T is separated into a sum of computation and communication time, which requires little or no code instrumentation because in practice all communications pass through a single library such as MPI that typically provides profiling data already. The ability to predict computation and communication time separately is useful in its own right, because the computation/communication ratio is a common measure of parallelization efficiency, but it also allows applying knowledge of crude scaling laws. Although a precise formula for the performance of complex software is difficult to obtain, one almost always knows the complexity in an asymptotic sense, e.g. whether it scales as $\Theta(N)$ vs. $\Theta(N^2)$ in the number N of grid points. By factoring out this asymptotic scaling from the computation and communication terms and using ANNs for the coefficients of the scaling, the ANNs can be trained with much less data: the closer a function is to a constant, the easier it is to learn.

In particular, for finite-difference time-domain (FDTD) simulations, the time T per FDTD timestep is factored as:

$$T(\vec{p}) = \frac{W(\vec{p}) \times N}{P} + C(\vec{p}) \times S \quad \text{Equation (1)}$$

where $$\frac{W(\vec{p}) \times N}{P}$$

provides the computation time, $C(\vec{p}) \times S$ provides the communication time, N is the total number of grid points, P is the total number of processors (or processing elements), and S is the maximum surface area of any processor's subdomain (since timestepping in FDTD simulations is synchronous, C×S is determined by the process that requires the most communication). This equation factors out the knowledge that the computational work of FDTD scales asymptotically as $$\Theta\left(\frac{N}{P}\right),$$

the number of grid points per processor/processing element, and that the communication cost scales roughly with the area. Of course, these scalings are not exact, so ANNs may be trained for the coefficient functions W(p) (computation) and C(p) (communication) as described below in order to account for all of the complications that such crude scalings omit.

Moreover, since the objective is minimizing relative error, ANNs may actually be fit to log W and log C, and similarly the logarithms of most inputs may be taken. As described below, this factorization results in a dramatic improvement in accuracy compared to naively fitting T directly, and numerous further refinements are possible.

FIG. 1 is a schematic drawing that illustrates a non-limiting example embodiment of a machine learning architecture that may be used to predict simulation times according to various aspects of the present disclosure. As discussed above, a simple set of input values 102 for a given design may be determined. For some FDTD simulations, an appropriate set of input values 102 may include a number of segment types in the design and a total number of segments in the design. The input values 102 also includes a number of processing elements to be used to conduct the simulation.

In the architecture illustrated in FIG. 1, the input values 102 are provided to a computation time model 104 and a communication time model 106. The computation time model 104 may be any suitable type of machine learning model, including but not limited to an ANN (for example, it could be a linear regression), that is trained to determine the coefficient W(p). The communication time model 106 may be any suitable type of machine learning model, including but not limited to an ANN (for example, it could be a linear regression), that is trained to determine the coefficient C(p) Once the outputs of the computation time model 104 and the communication time model 106 are used as these coefficients, Equation (1) can be used to predict the total time 108.

As discussed above, one example of a simulation of a physical problem that may be processed using embodiments of the present disclosure is a finite-difference time-domain (FDTD) simulation of electromagnetism (EM). EM modeling is central to much of science and engineering, from scales ranging from radar (meters) to X-rays (nanometers), for a vast array of applications from photovoltaics, to imaging, to optical and electromagnetic devices. The FDTD method is popular because of its generality, flexibility, and scalability to large parallel computations. For a given computational domain (spatial region), it discretizes space into a grid of unknowns (EM fields); on each discretized "timestep" the fields everywhere in the grid are updated (via nearest-neighbor interactions) to a new value. A typical simulation problem (e.g. to determine how light waves are absorbed by an image sensor or how light waves propagate through an optical device) requires many thousands of timesteps to model the wave propagating all the way through the domain.

Figure 2:
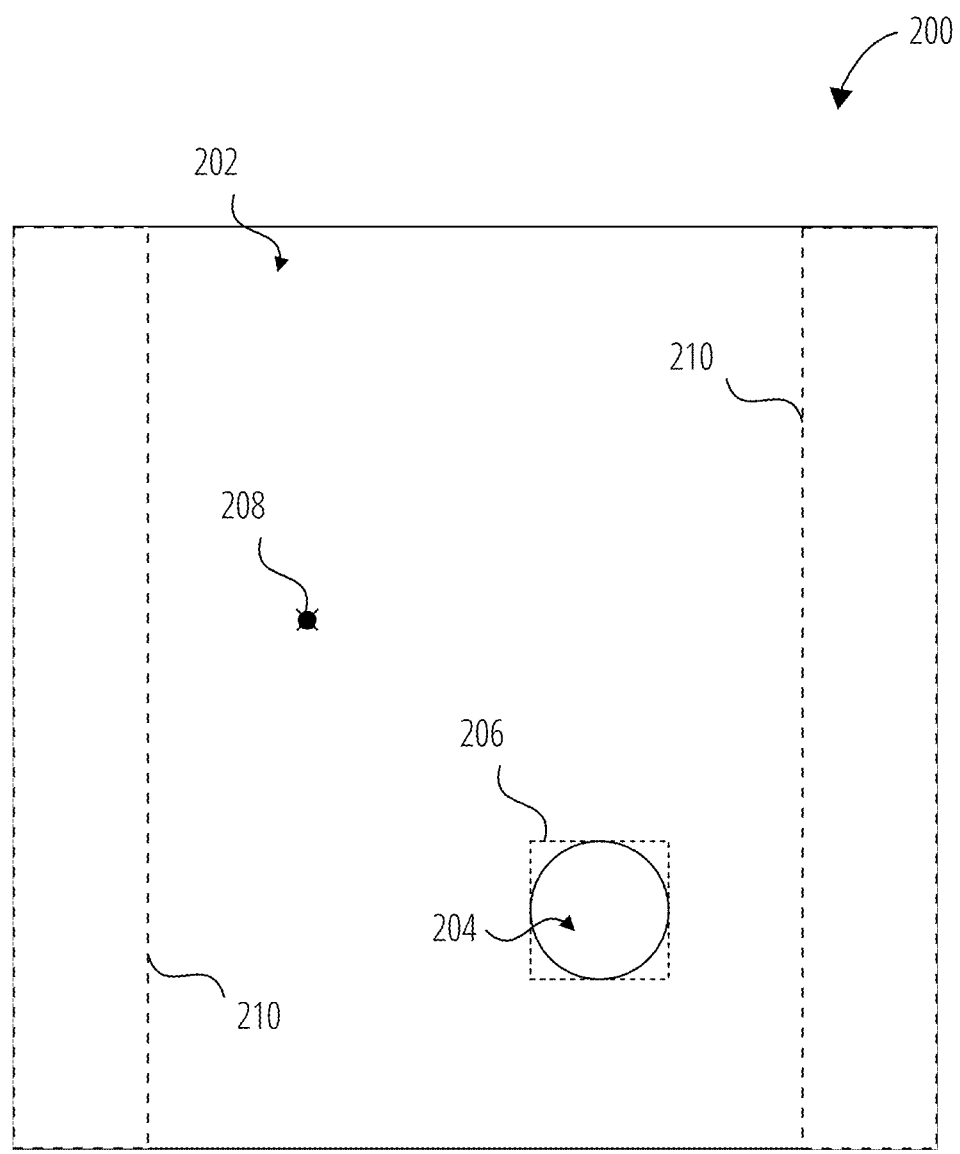
FIG. 2 is a schematic diagram that illustrates a non-limiting example of a device to be simulated using FDTD.

FIG. 2 is a schematic diagram that illustrates a non-limiting example of a device to be simulated using FDTD. Typically, the design 200 for the device is defined by a set of segments. Each segment may indicate various characteristics for the associated portion of the design, including but not limited to a material present in the segment and a type of data processing for the segment (e.g., a discrete Fourier Transform (DFT) field monitor or a perfectly matched layer (PML) absorbing boundary). For a two-dimensional design such as the design 200 illustrated in FIG. 2, each segment may be a two-dimensional pixel. However, this example should not be seen as limiting. For instance, for a three-dimensional design, each segment may be a three-dimensional voxel. Further, each segment may be a uniform shape (e.g., a two-dimensional square, rectangle, hex, or other two-dimensional shape; a three-dimensional cube, rectangular prism, hexagonal prism, or other three-dimensional shape), or may be different sizes or different shapes, depending on the specific design. Accordingly, the terms pixel, and voxel may be used interchangeably herein with the term segment, and may refer to segments of any dimension and/or shape.

A typical FDTD problem may be heterogeneous, such as the design 200 illustrated in FIG. 2: different points in the spatial grid require different computations depending on the materials being modeled at each point. The simplest material is vacuum, whereas more complicated updates are required at grid points with nonlinear materials or materials with frequency-dependent responses, for example. Certain points in the design 200, such as points associated with source 208, might have "source" terms generating waves (like a physical antenna). Adjacent to the edges of the domain there are often artificial absorbing layers called perfectly matched layers (PMLs, such as PMLs 210) to inhibit unwanted reflections from the boundaries, which are represented with additional unknowns and more complicated update equations. Additionally, in some regions, one may perform expensive post-processing of the data at every timestep for output analysis, such as accumulating discrete-time Fourier transforms (DFTs) at certain points, such as at DFT monitor 206, to obtain scattering spectra from a boundary between a first material 202 and a second material 204. This heterogeneity complicates the modeling of execution time—it is not simply a function of the total number of grid points per processor as assumed in many previous works—and it also complicates parallelization.

Figure 3:
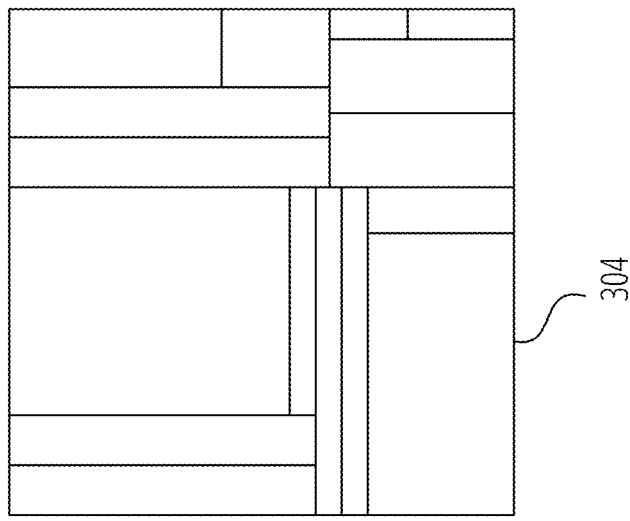
FIG. 3 is a schematic drawing that illustrates a non-limiting example of an even distribution of simulation work and a load-balanced distribution of simulation work according to various aspects of the present disclosure.
Figure 3:
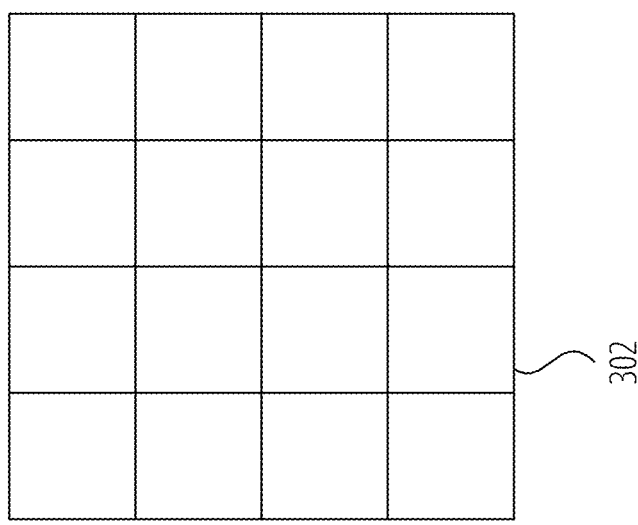

FIG. 3 is a schematic drawing that illustrates a non-limiting example of an even distribution of simulation work and a load-balanced distribution of simulation work according to various aspects of the present disclosure. As mentioned above and indicated schematically in FIG. 3, benefits may be obtained by avoiding simply dividing the domain to be simulated into equal-volume pieces, as shown in even distribution 302. Instead, a data-driven heuristic cost function may be used for each type of physics/analysis, and the domain may be partitioned into a load-balanced distribution 304 in order to equalize the computational cost for simulating each sub-domain.

Many previous works on mesh-partitioning methods minimized only the surface area of the divisions (assuming the cost per grid point is constant), since communications are required between adjacent grid points; this communications scaling is incorporated in the performance model of the equation listed above. Instead, a generalization of a recursive bisection strategy for mesh partitioning with heterogeneous computational loads may be employed.

In order to estimate the relative loads, a regression technique is used. Load balancing also simplifies the task of predicting execution time: for an unbalanced simulation, the time will be determined by the slowest process, and predicting this would require the ANN to understand the exact spatial distribution of computation costs. In contrast, for a balanced simulation the runtime is determined by the types of computations but not where they occur, allowing a simpler ANN (with fewer inputs and training data) to yield accurate predictions.

A starting point of developing a load-balanced partitioning strategy is determining a way to estimate the computational work required by a given subvolume. Given such an estimate, a recursive-bisection method may then be employed: recursively divide the domain in half along coordinate directions (typically along the current longest axis to minimize surface area, i.e. communication) so that the two halves contain equal work. For non power-of-two numbers of processors/processing elements P, we generalize this in simulation execution software, such as the open-source Meep software package maintained by Simpetus, LLC, to equal-work multisections (trisection etc.) according to the prime factors of P. For finite-difference grids and other well-formed meshes, recursive bisection is provably within a small constant factor of the optimal surface area. In fact, an estimate of the absolute computational work of a sub-volume is not necessary: the only need is to estimate the relative work of two subvolumes (the ratio).

To estimate the relative costs of subvolumes, a linear regression model is constructed from a set of training data extracted from small serial executions. This model is based on the observation that the computations for different material features (e.g. nonlinearity or frequency dependence) and analyses (e.g. Fourier transforms) are performed separately for each grid point where they are used in the FDTD algorithm, so their costs should be roughly additive and linear in the number of affected grid points. Under these assumptions, the regression coefficients can be quickly extracted by timing a set of eight 3d simulations for each parameter in which the number of grid points for only a single material was varied. Using this procedure, we extracted regression coefficients for 10 different features, representing the most expensive computations for typical simulations (including material anisotropy, nonlinearity, frequency-dependent materials, PML, Fourier analysis, and conductive materials). The relative cost for any subvolume is then estimated by computing the number of segments of each of these types and multiplying by the regression coefficients.

Given the cost estimate, the cell is then recursively bisected along one coordinate axis at a time to make the costs of the two halves as equal as possible (as determined by a binary search of cut positions, since the cost estimate is monotonic in the cut position). The longest axis of the current domain is bisected in order to minimize surface area (communications). (As an exception, the bisection is along a shorter axis if the load balancing is much better, by more than 30%, along that axis.) One can easily construct synthetic examples where load balancing improves performance by a factor of P, via problems that are essentially serialized by an equal partition. For realistic computations, Meep users have reported improvements by factors of 2 or more.

One will note that these techniques will result in subregions that are of differing sizes, as shown by load-balanced distribution 304. When executing parallel simulations on a plurality of computing devices, each computing device is responsible for updating all of the segments for its assigned subregion and communicating the segments on its subregion boundaries to computing devices processing the neighboring subregions. Since the load-balanced subregions will have differing surface areas (and hence differing numbers of segments on its subregion boundaries to communicate), the communication cost for each subregion may be different. In some embodiments, a subregion with a largest surface area (and hence the greatest communication cost) may be used in the context of the training and use of the communication time model 106 as described herein.

Figure 4:
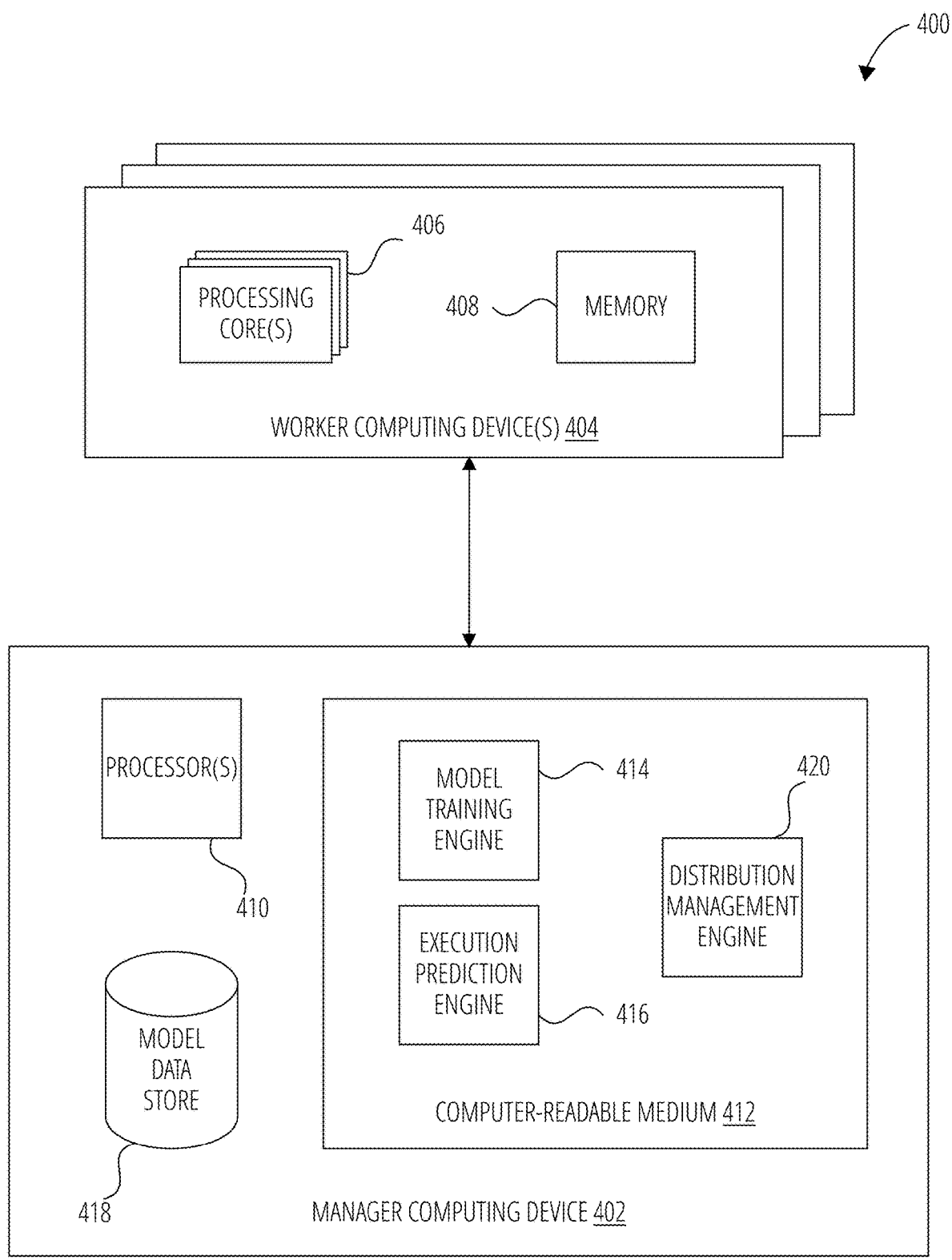
FIG. 4 is a block diagram that illustrates a non-limiting example embodiment of a system for optimizing parallel execution of simulations according to various aspects of the present disclosure.

FIG. 4 is a block diagram that illustrates a non-limiting example embodiment of a system for optimizing parallel execution of simulations according to various aspects of the present disclosure. As shown, the system 400 includes a manager computing device 402 and one or more worker computing devices 404.

In some embodiments, the manager computing device 402 is configured to train ANNs to predict execution times. In some embodiments, the manager computing device 402 is configured to use trained ANNs to predict execution times, and to use the predicted execution times to determine an optimum execution architecture for simulation of a new design. The manager computing device 402 may use worker computing devices 404 to deploy the optimum execution architecture and execute simulations for the new design. Any suitable type of computing device may be used as the manager computing device 402, including but not limited to a desktop computing device, a laptop computing device, a rack-mount computing device, and a cloud computing device. Further, though illustrated as a single computing device, in some embodiments the functionality of the manager computing device 402 may be provided by a plurality of computing devices operating together to provide the described functionality.

In the illustrated embodiment, the manager computing device 402 includes one or more processors 410, a model data store 418, and a computer-readable medium 412. The one or more processors 410 may include any suitable type of processor, including general-purpose processors and processors optimized for particular purposes (including but not limited to graphics processing units (GPUs) and tensor processing units (TPUs)). In some embodiments, the model data store 418 is configured to store machine learning models trained by the manager computing device 402. In some embodiments, the computer-readable medium 412 includes any suitable type of medium for storing the logic descried below.

As used herein, "computer-readable medium" refers to a removable or nonremovable device that implements any technology capable of storing information in a volatile or non-volatile manner to be read by a processor of a computing device, including but not limited to: a hard drive; a flash memory; a solid state drive; random-access memory (RAM); read-only memory (ROM); a CD-ROM, a DVD, or other disk storage; a magnetic cassette; a magnetic tape; and a magnetic disk storage.

As used herein, "data store" refers to any suitable device configured to store data for access by a computing device. One example of a data store is a highly reliable, high-speed relational database management system (DBMS) executing on one or more computing devices and accessible over a high-speed network. Another example of a data store is a key-value store. However, any other suitable storage technique and/or device capable of quickly and reliably providing the stored data in response to queries may be used, and the computing device may be accessible locally instead of over a network, or may be provided as a cloud-based service. A data store may also include data stored in an organized manner on a computer-readable storage medium, such as a hard disk drive, a flash memory, RAM, ROM, or any other type of computer-readable storage medium. One of ordinary skill in the art will recognize that separate data stores described herein may be combined into a single data store, and/or a single data store described herein may be separated into multiple data stores, without departing from the scope of the present disclosure. In some embodiments, the illustrated model data store 418 may be provided by the manager computing device 402. In some embodiments, the illustrated model data store 418 may be provided by a separate computing device (or computing devices) from the manager computing device 402, and accessed by the manager computing device 402 via a network or via another communication technique.

In some embodiments, the computer-readable medium 412 has logic stored thereon that, in response to execution by the processors 410, cause the manager computing device 402 to provide a model training engine 414, an execution prediction engine 416, and a distribution management engine 420. In some embodiments, the model training engine 414 is configured to generate training data and to train one or more machine learning models using the generated training data. In some embodiments, the execution prediction engine 416 uses one or more machine learning models trained by the model training engine 414 to predict execution times for new designs. In some embodiments, the distribution management engine 420 uses predictions from the execution prediction engine 416 to determine an optimum execution architecture for new designs, and then deploys the optimum execution architecture to simulate the new designs. Further details of the actions performed by each of these components will be provided below.

In the illustrated embodiment, each worker computing device 404 may be any suitable type of computing device, including but not limited to virtual or physical cloud computing devices, server computing devices, desktop computing devices, or cluster computing devices. In some embodiments, each worker computing device 404 includes one or more processing cores 406 and a memory 408. In some embodiments, the processing cores 406 may be included in a single processor. In some embodiments, the processing cores 406 may be split among multiple processors of each worker computing device 404. In some embodiments, the processing cores 406 may be general purpose processors or cores of general purpose processors. In some embodiments, the processing cores 406 may be cores of special-purpose processing units, including but not limited to GPUs or TPUs. In some embodiments, the memory 408 may include any suitable type of computer-readable medium for storing instructions and/or information to be processed by the processing cores 406.

One will note that the manager computing device 402 and the worker computing devices 404 may include many other components than those illustrated in FIG. 4 that are known to those of ordinary skill in the art. These additional components have not been illustrated in order to avoid obscuring the portions of the manager computing device 402 and the worker computing devices 404 relevant to the present disclosure.

Figure 5:
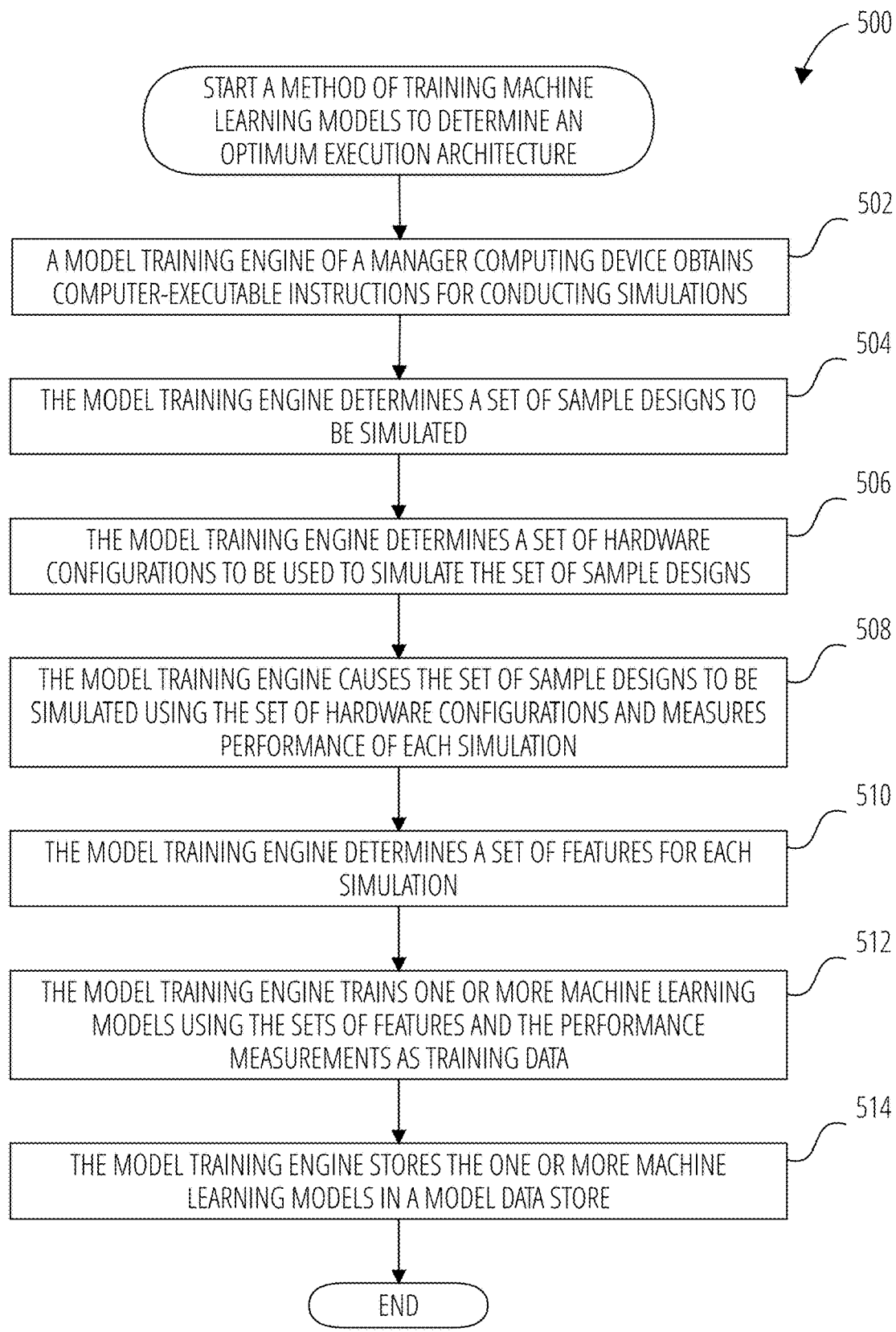
FIG. 5 is a flowchart that illustrates a non-limiting example embodiment of a method of training machine learning models to determine an optimum execution architecture according to various aspects of the present disclosure.

FIG. 5 is a flowchart that illustrates a non-limiting example embodiment of a method of training machine learning models to determine an optimum execution architecture according to various aspects of the present disclosure. In the method 500, the manager computing device 402 generates training data for a given type of simulation and uses the training data to train one or more machine learning models to predict execution times for the given type of simulation. Due to the design of the machine learning models and the equations used to formulate the output of the machine learning models to predict execution times, the machine learning models can be trained using a much smaller amount of training data than previous techniques, thus allowing the method 500 to be usable in more situations and to be more effective.

From a start block, the method 500 proceeds to block 502, where a model training engine 414 of a manager computing device 402 obtains computer-executable instructions for conducting simulations. For example, computer-executable instructions for conducting an FDTD simulation, including but not limited to instructions for dividing portions of a design into subdesigns, instructions for distributing the subdesigns to worker computing devices 404, instructions for execution by the worker computing devices 404 to conduct the FDTD simulation of the subdesigns, and instructions for gathering and combining the results of the subdesign simulations into an overall simulation result. One non-limiting example of such computer-executable instructions is provided by the Meep software package. The use of Meep for FDTD simulations is an example only and should not be seen as limiting; in some embodiments, other software for conducting FDTD simulations, or software for conducting other types of simulations, may instead by used.

At block 504, the model training engine 414 determines a set of sample designs to be simulated. In some embodiments, a predetermined set of sample designs may be provided to the model training engine 414. In some embodiments, the model training engine 414 generate random designs for the set of sample designs within a relevant search space. For example, the model training engine 414 may be instructed to generate random designs having a given number of segment types and a given total number of segments.

At block 506, the model training engine 414 determines a set of hardware configurations to be used to simulate the set of sample designs. Each hardware configuration may specify a type of processing element and a number of processing elements to be instantiated. In some embodiments, a processing element may refer to an entire worker computing device 404, particularly if the worker computing device 404 is the atomic unit by which worker computing devices 404 can be instantiated by the manager computing device 402. In some embodiments, a processing element may refer to an individual processing core 406. Typically, each hardware configuration may specify the same type of processing element (e.g., a particular type of cloud computing instance or a particular cluster component to be instantiated as a worker computing device 404). For such embodiments, it is assumed that the type of processing element used in the method 500 matches a type of processing element to be used for simulation execution (such as in method 600). However, in some embodiments, some hardware configurations in the set of hardware configurations may specify different types of worker computing devices 404, including but not limited to worker computing devices 404 with different numbers of processing cores 406 and/or different amounts of memory 408.

In some embodiments, the set of hardware configurations collectively specifies a variety of hardware configurations having different numbers of processing elements. For example, in some embodiments, the set of hardware configurations may include a first hardware configuration that specifies two worker computing devices 404 should be used, a second hardware configuration that specifies three worker computing devices 404 should be used, a third hardware configuration that specifies four worker computing devices 404 should be used, and so on. Though this example uses worker computing devices 404 as the processing elements, in other embodiments, processing cores 406 may be used as the processing elements for which different numbers are provided in the set of hardware configurations.

At block 508, the model training engine 414 causes the set of sample designs to be simulated using the set of hardware configurations and measures performance of each simulation. In some embodiments, the model training engine 414 takes each combination of sample design and hardware configuration, instantiates the given hardware configuration using one or more worker computing devices 404, and uses the one or more worker computing devices 404 to execute the simulation of the given sample design. In some embodiments, the model training engine 414 receives a total computation time and a total communication time for each simulation from each worker computing device 404. This performance information may be generated by instrumentation added to a communication library or the simulation instructions provided to the worker computing devices 404.

At block 510, the model training engine 414 determines a set of features for each simulation. In some embodiments, the features determined for each simulation may include features based on the associated design and features based on the hardware configuration used to execute the simulation. In some embodiments, the number of processing elements specified by the hardware configuration may be used as a feature. In some embodiments, a number of segment types included in the design and a total number of segments included in the design may be used as features. By using a small number of features, the model training engine 414 may train one or more machine learning models using less training data, which is advantageous because the generation of training data at block 508 may be time consuming. In some embodiments, more or different features may be used to characterize the designs and/or the hardware configurations.

At block 512, the model training engine 414 trains one or more machine learning models using the sets of features and the performance measurements as training data. In some embodiments, each set of features may be labeled using the corresponding performance measurements to create the training data. In some embodiments, the labeled training data may be used to train a computation time model for predicting a value usable to compute the computation time, and to train a communication time model for predicting a value usable to compute the communication time. As discussed above, the value usable to compute the computation time may be the W(p) value of Equation (1), and the value usable to compute the communication time may be the C(p) value of Equation (1). In some embodiments, the computation time model and the communication time model may be implemented using artificial neural networks, and the training thereof may be performed using any suitable optimization technique, including but not limited to gradient descent, backpropagation, the Adam optimizer, the RMSProp optimizer, and the AdaGrad optimizer. The computation time model and the communication time model may also be implemented using linear regression.

At block 514, the model training engine 414 stores the one or more machine learning models in a model data store 418. The method 500 then proceeds to an end block and terminates.

Figure 6:
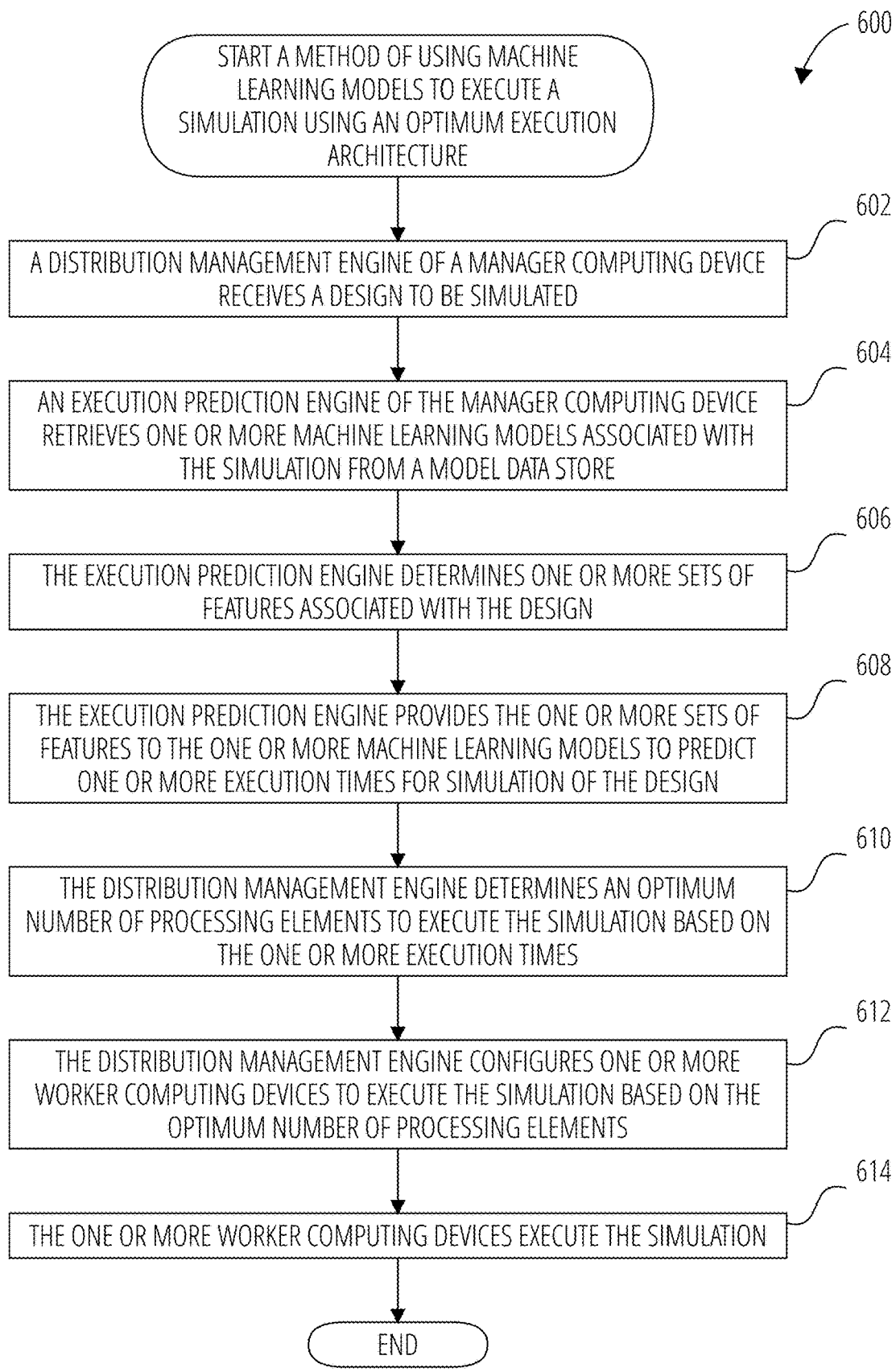
FIG. 6 is a flowchart that illustrates a non-limiting example embodiment of a method of using machine learning models to execute a simulation using an optimum execution architecture according to various aspects of the present disclosure.
Figure 7:
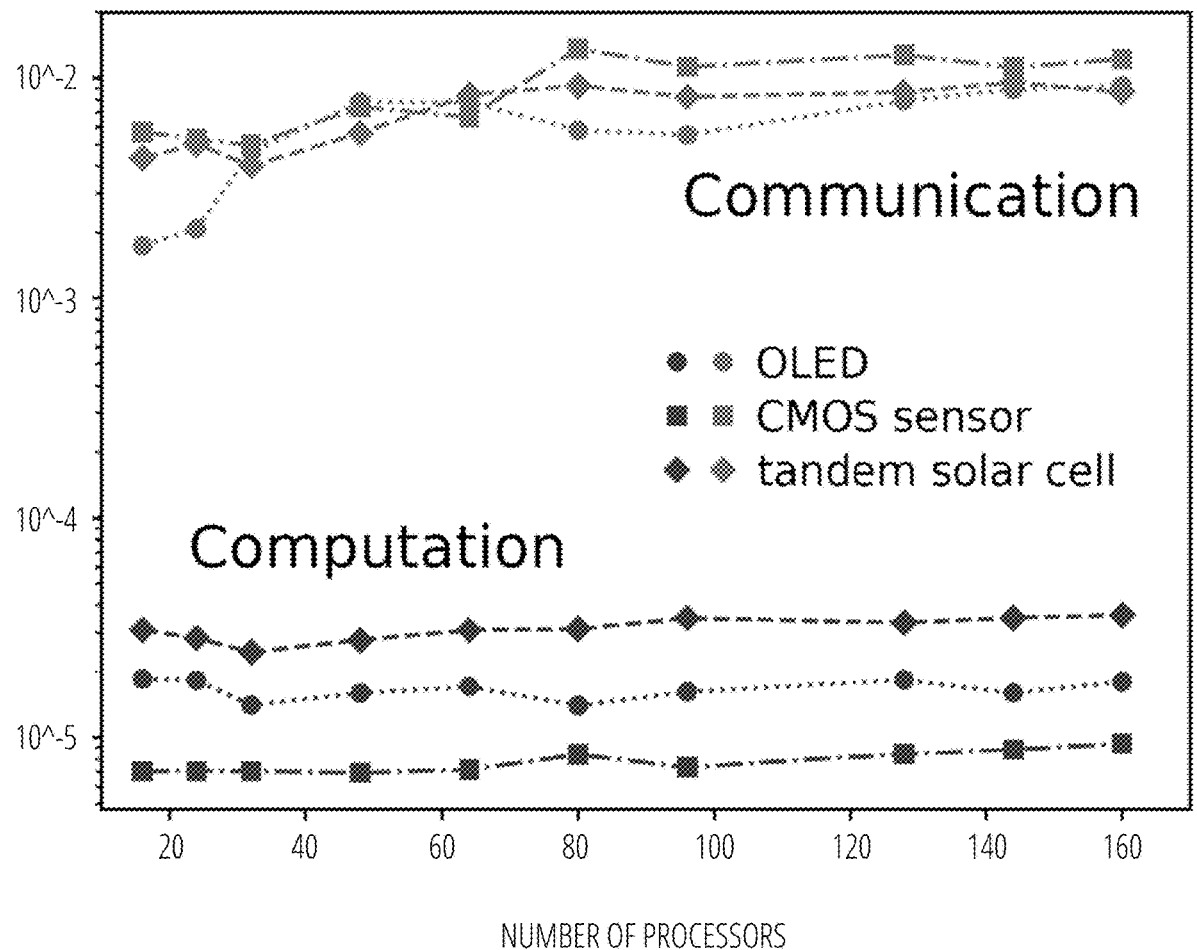
FIG. 7-FIG. 10 are charts that illustrate experimental results that show the accuracy of the predictions generated by embodiments of the preset disclosure, thus proving that such embodiments are useful for determining optimum execution architectures and thereby avoiding waste of computing resources.

FIG. 6 is a flowchart that illustrates a non-limiting example embodiment of a method of using machine learning models to execute a simulation using an optimum execution architecture according to various aspects of the present disclosure. In the method 600, the manager computing device 402 uses the machine learning models trained by the method 500 described above to predict execution times with varying numbers of processing elements, and thereby determines an optimum number of processing elements to include in an execution architecture. The manager computing device 402 then instantiates the optimum execution architecture and uses it to conduct the simulation. By accurately predicting an optimum number of processing elements for conducting the simulation, peak performance can be achieved without utilizing computing resources that will either not meaningfully contribute to performance gains or that will actually cause worse performance.

From a start block, the method 600 proceeds to block 602, where a distribution management engine 420 of a manager computing device 402 receives a design to be simulated. At block 604, an execution prediction engine 416 of the manager computing device 402 retrieves one or more machine learning models associated with the simulation from a model data store 418. In some embodiments, the distribution management engine 420 may determine a type of simulation to be conducted (e.g., a FDTD simulation) based on the design, and may retrieve one or more machine learning models trained based on the type of simulation. In some embodiments, the distribution management engine 420 may determine a type of worker computing device 404 to be used for the simulation, and may retrieve one or more machine learning models trained based on the determined type of worker computing device 404. As discussed above, the one or more machine learning models may include a computation time model and a communication time model.

At block 606, the execution prediction engine 416 determines one or more sets of features associated with the design. The features determined by the execution prediction engine 416 may mirror the features determined by the model training engine 414 at block 510 of method 500, such as a number of segment types and a total number of segments. Each set of features determined by the execution prediction engine 416 may also include a unique hardware configuration to be paired with the features based solely on the design. That is, a first set of features may include a number of segment types, a total number of segments, and a first number of processing elements; a second set of features may include the number of segment types, the total number of segments, and a second number of processing elements; and so on. In this way, each set of features may serve as a set of input values for the one or more machine learning models.

At block 608, the execution prediction engine 416 provides the one or more sets of features to the one or more machine learning models to predict one or more execution times for simulation of the design. Typically, the sets of features include a variety of numbers of processing elements such that the execution times for different numbers of processing elements can be predicted. In some embodiments, the outputs of the machine learning models may be used as coefficients in a function such as Equation (1), and the function may be used to determine the final prediction of execution time for a given set of features.

At block 610, the distribution management engine 420 determines an optimum number of processing elements to execute the simulation based on the one or more execution times. In some embodiments, the distribution management engine 420 extrapolates the optimum number of processing elements based on the predicted results of the various sets of features from block 608.

Once the optimum execution architecture is determined, the distribution management engine 420 can instantiate the optimum execution architecture for conducting the simulation of the design. Accordingly, at block 612, the distribution management engine 420 configures one or more worker computing devices 404 to execute the simulation based on the optimum number of processing elements. In some embodiments, this may involve instantiating a number of cloud computing devices, reserving cluster resources, or performing other automated tasks for setting up the worker computing devices 404 specified by the optimum execution architecture.

At block 614, the one or more worker computing devices 404 execute the simulation. Naturally, results of the simulation determined by the worker computing devices 404 may be provided to the distribution management engine 420, which may store the results for later processing, present the results to a user, or perform any other suitable task using the results. The method 600 then proceeds to an end block and terminates.

FIG. 7-FIG. 10 are charts that illustrate experimental results that show the accuracy of the predictions generated by embodiments of the preset disclosure, thus proving that such embodiments are useful for determining optimum execution architectures and thereby avoiding waste of computing resources. In these experimental results, the computation time is the sum of the time spent on (1) timestepping and (2) Fourier transforming the fields at selected points in a design (for output analysis). The communication time is the time spent sending or receiving messages via MPI (or time spent waiting at synchronization barriers). The times were rescaled by rough asymptotic scaling factors to arrive at the coefficients W and C to be predicted by the computation time model and the communication time model, respectively.

The expectation was that these coefficients would thereby have much less variation and hence be easier for an ANN to interpolate from limited training data. Evidence for this can be seen directly in FIG. 7, it is shown that W and C have relatively small dependence on the number P of processors for several realistic problems. Note, however, that TV and C still exhibit order-of-magnitude variations with other parameters of the simulations p, which the ANNs do learn. Below, it is shown that the resulting ANNs can predict the execution time with reasonable accuracy; in contrast, the errors that were obtained were many times larger when initially a single ANN was trained to directly predict the total time T(p).

At first, a simple estimates $S \approx (N/P)^{2/3}$ was used of the average surface area, but a factor of ~3 improvement was obtained in C prediction accuracy by scaling instead by the actual surface area computed by the load-balancing algorithm, which much more accurately reflects the influence of geometry on communication.

All Meep simulations comprising the training and test data were benchmarked using Amazon Web Services (AWS) Elastic Compute Cloud (EC2) via MPICH clusters of c5.4× large instances (16 virtual CPUs, Intel Xeon Cascade Lake). In terms of the present description, each c5.4×large instance was considered a processing element. AWS ParallelCluster was used for the cluster setup and management. Each instance was running Amazon Linux with hyperthreading disabled (since Meep is parallelized using MPI, there would be a substantial overhead to using more processes than physical cores). For all simulations, the computation and communication times were averaged over 100 timesteps. We verified the consistent performance of EC2 clusters by running three different test simulations 10 different times each. The coefficient of variation of the runtime was less than 1% in all cases.

Rather than include all segment types in the analysis, only a subset of the four most-common types found in physical simulations were used: susceptibility (for dispersive materials with complex, wavelength-dependent refractive index), discrete Fourier transform (for electromagnetic field monitors used to compute Poynting flux, near-to-far field transformations, energy density, etc.), PML with absorption in a single direction (for simulating open boundaries in the non-periodic direction of a cell with 2d periodic boundaries), and absorber boundary layers (for truncating dispersive materials and other cases in which PMLs often fail and require a workaround). The total number N of segments and the number P of processors were also ANN inputs. Randomly generated simulations with random segment-count distributions were used for training the ANNs. These random simulations are based on a 3d cell comprising three non-overlapping contiguous regions of: (1) crystalline silicon (susceptibility), (2) Poynting-flux monitor (DFT), and (3) isotropic permittivity with wavelength-independent refractive index of 3.5. The PML and absorber surround the cell in two different directions and overlap only vacuum. The training set consists of 6840 samples subdivided into 16, 24, 32, 48, and 64 processor-count samples (corresponding to 2, 3, 4, 6, and 8 instances or processing elements) of 1346, 1338, 1798, 1637, and 721, respectively.

For validation, both additional random simulations as well as three physical simulations based on actual engineering applications are used: (1) visible-light extraction efficiency of an organic light-emitting diode (OLED), (2) infrared-light absorption of a complimentary metal-oxide semiconductor (CMOS) image sensor, and (3) light absorption of a tandem solar cell. The main variables in each of these physical simulations were the grid resolution, the number of frequencies of the DFT monitors, the size of the cell, and the thickness of the PML/absorber boundary layers. Although the training was done using only random simulations, the distribution of segment types in the random simulations was chosen to overlap the distributions found in the real engineering simulations to ensure that our ANNs were interpolating rather than extrapolating. In addition, all of the training and test data has a communication/computation ratio <0.9 to ensure that they are in the practically relevant regime of efficient parallelization.

The machine-learning models were based on feed-forward ANNs implemented via the PyTorch framework, with an activation function of a leaky rectified linear unit (ReLU), using a loss function of a mean-squared error (MSE) in log W or log C as explained above. There are six inputs to each ANN, grouped into two categories: (1) the fractional number of the four pixel types (normalized by the total number of pixels in the cell), (2) the total number of pixels, and (3) the number of processors. The inputs are also normalized using a log transform, both to limit the range of the inputs and also to allow the network to construct power-law models via linear combinations. The optimal ANN architecture for the computation and communication functions was determined by sweeping over the number of layers, neurons per layer, learning rate, and momentum. The training was stopped when the MSE of any one of the four validation data began to increase which is an indication of overfitting.

Figure 8A:
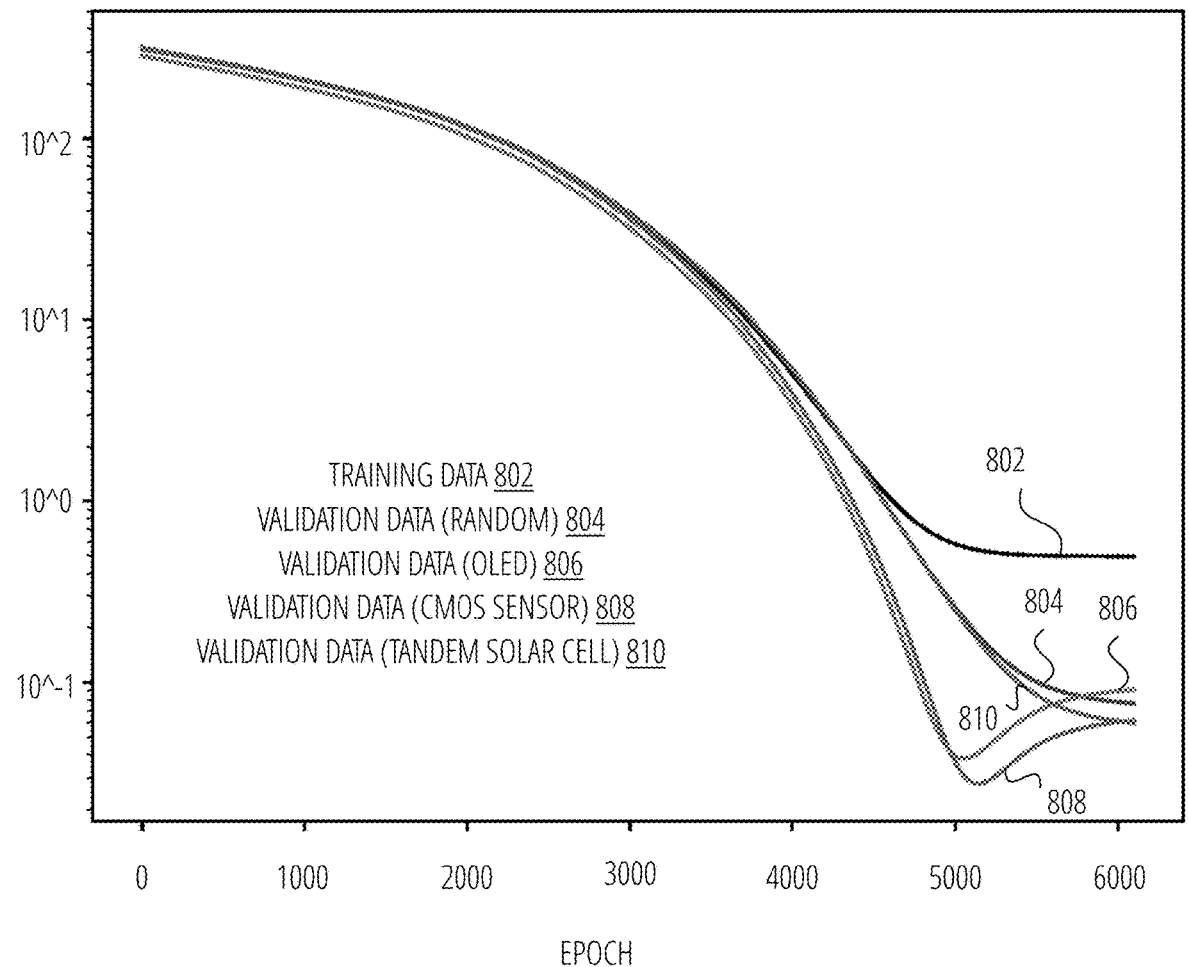
Figure 8B:
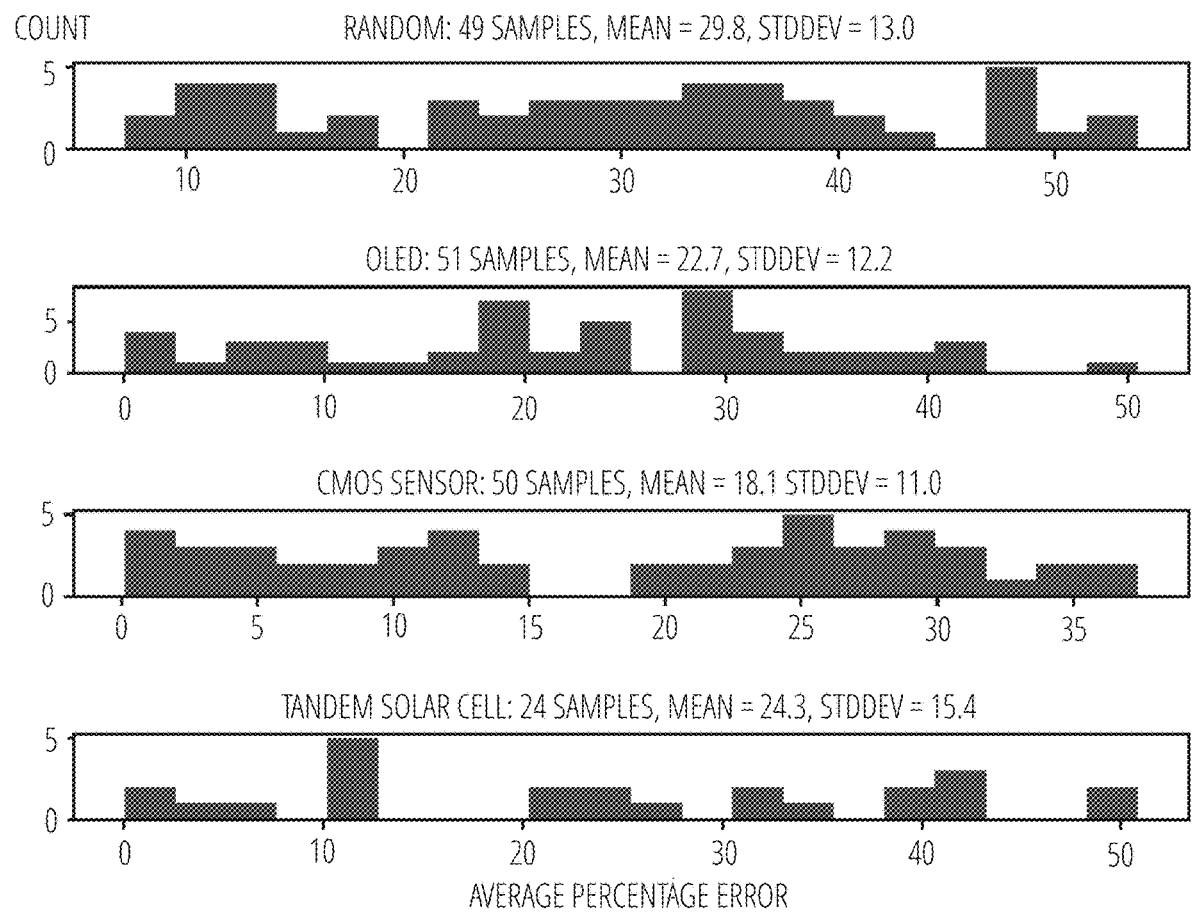

FIG. 8A and FIG. 8B show the training and inference results for the optimal ANN for the computation function which consists of two hidden layers with 30 and 60 neurons in each layer. The Adam optimizer is used with a learning rate of 0.000012 and momentum of 0.9. The number of epochs is 6100. FIG. 8A illustrates evolution of the loss function [mean-squared error (MSE)] during training via back propagation. The training data (top-most curve) based on random simulations is shown along with four sets of validation data. Increasing validation-data MSE and decreasing training-data MSE is an indication of overfitting. The training was stopped when the MSE of any one of the four validation data began to increase after reaching a minimum. FIG. 8B illustrates histograms of the average percentage error of the inferred computation for four sets of test data consisting of random/non-physical and physical simulations.

Figure 9A:
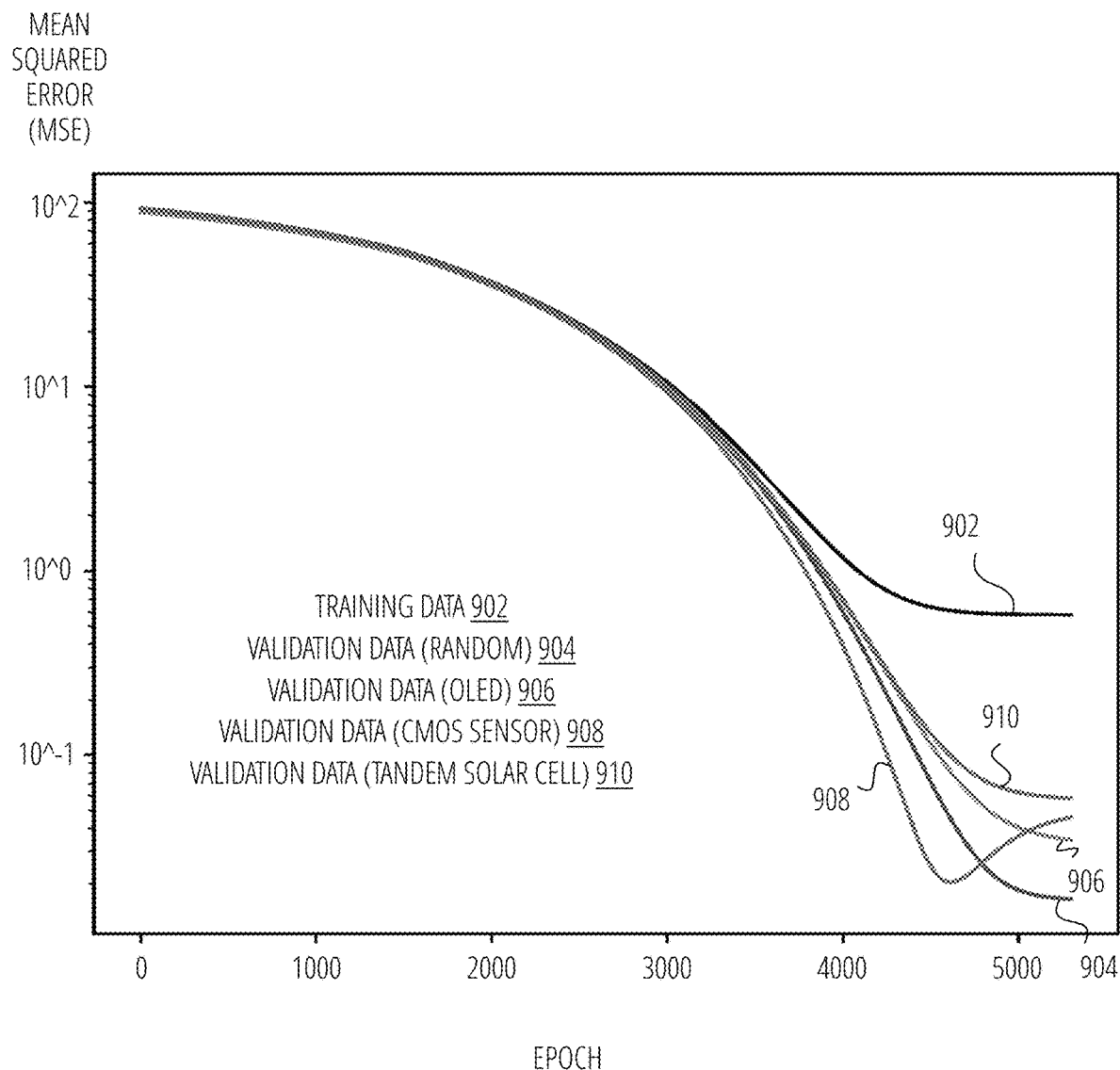
Figure 9B:
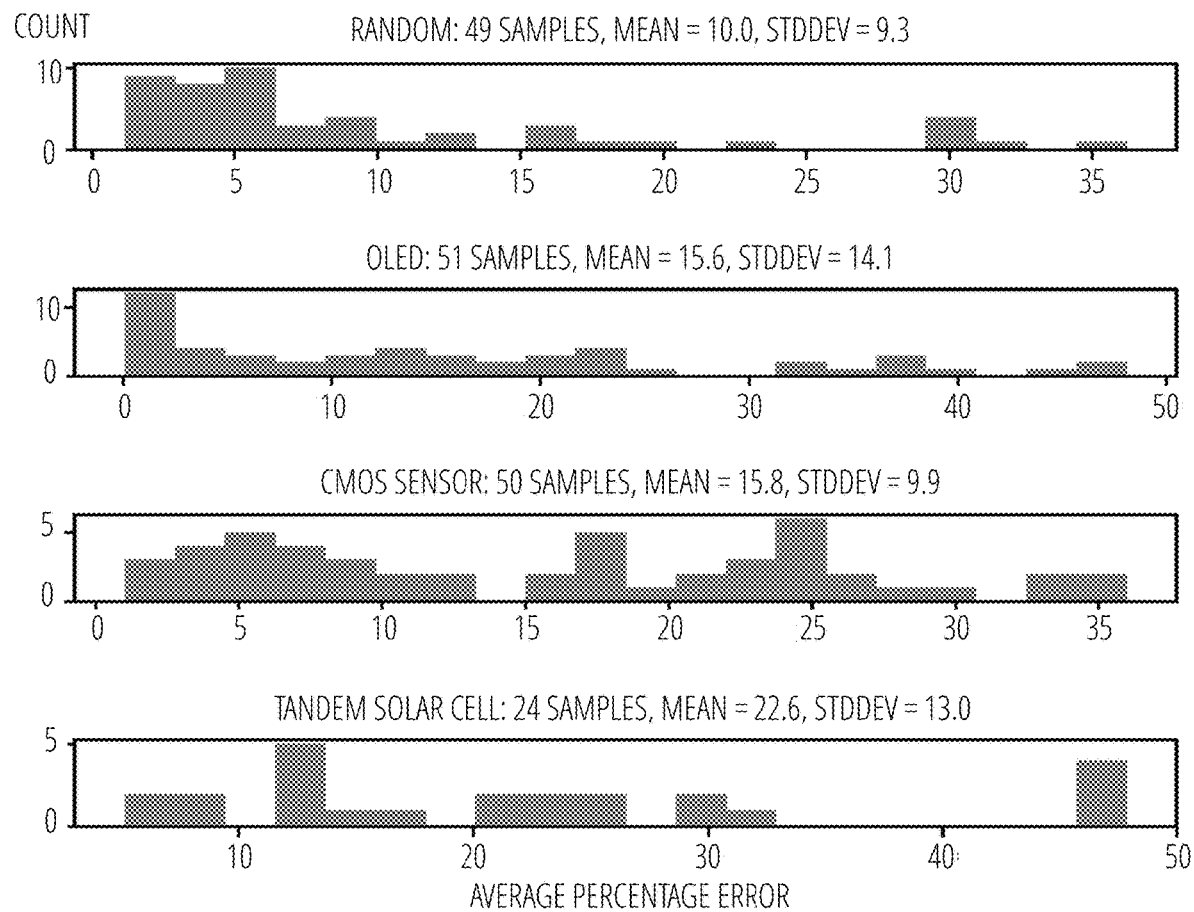

FIG. 9A and FIG. 9B show the training and inference results for the optimal ANN for the communication function which consists of three hidden layers with 20, 30, and 40 neurons in each layer. The Adam optimizer is used with a learning rate of 0.00001 and momentum of 0.9. The number of epochs is 5300. Other optimizers were also tried such as RMSProp, AdaGrad, etc. but these were not found to be optimal. FIG. 9A illustrates evolution of the loss function [mean-squared error (MSE)] during training via back propagation. The training data (top-most curve) based on random simulations is shown along with four sets of validation data. Increasing validation-data MSE and decreasing training-data MSE is an indication of overfitting. The training was stopped when the MSE of any one of the four validation data began to increase after reaching a minimum. FIG. 9B illustrates histograms of the average percentage error of the inferred computation for four sets of test data consisting of random/non-physical and physical simulations.

Figure 10:
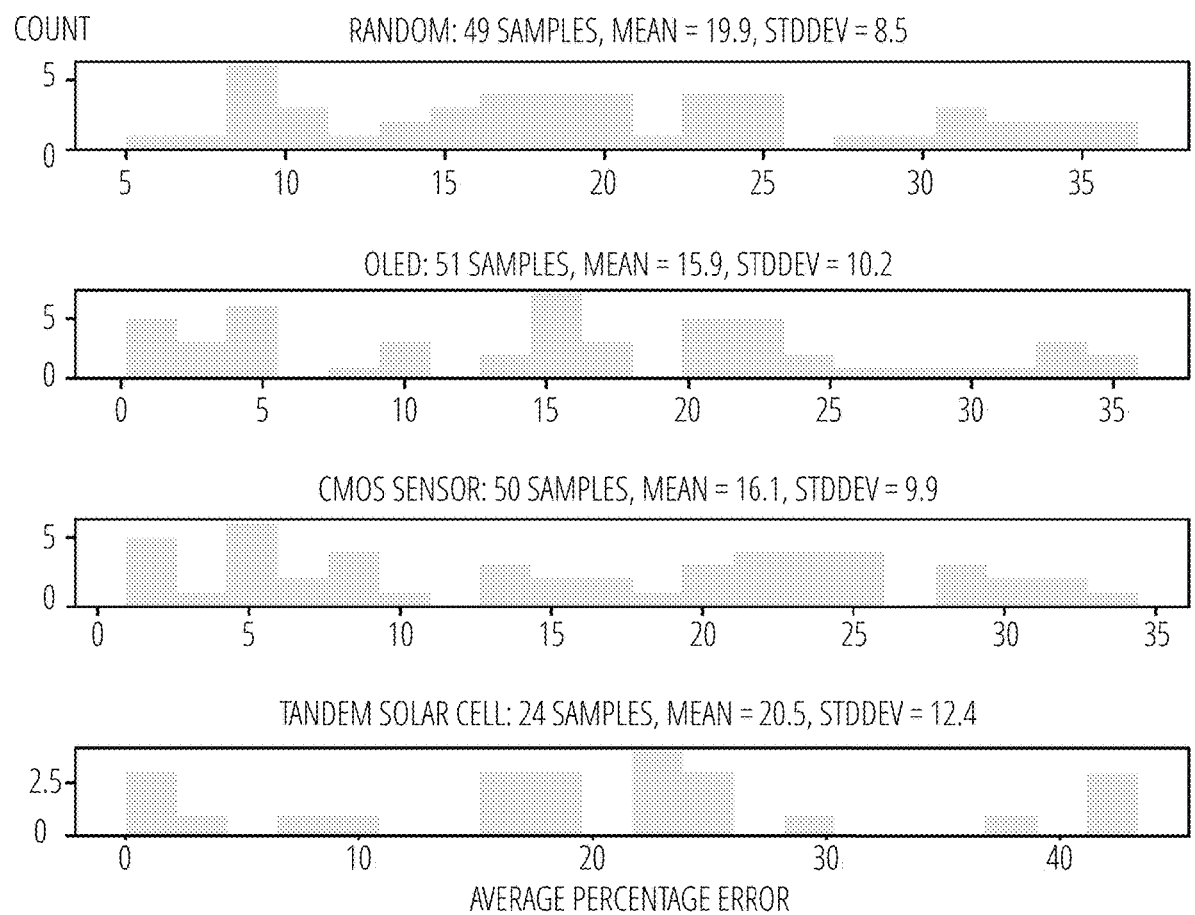

FIG. 10 shows the error histogram for the inferred total seconds per timestep obtained by combining the results for the computation and communication ANNs. The final result in FIG. 10 is that the total execution time T is always able to be predicted within a factor of two, with a typical mean ($\approx$median) error of around 20%, even for realistic simulations that had no direct analogue in the random training data. For comparison, rather than train two separate ANNs for the computation and communication, a single NN whose output was simply T(p), the execution time per timestep was also trained using the same training data. The results were found to be considerably worse, with a mean percentage error well above 100% in most cases. The largest errors are for the computation W. Conversely, if the N parameter is omitted from the ANNs, it is found that the prediction accuracy is nearly undiminished. Although including more inputs arguably improves ANN generality, there might be some advantage to employing only the fraction of each computation type: scale-invariant fractions allow simulations of very different sizes to interpolate within the same parameter space.

Figure 11:
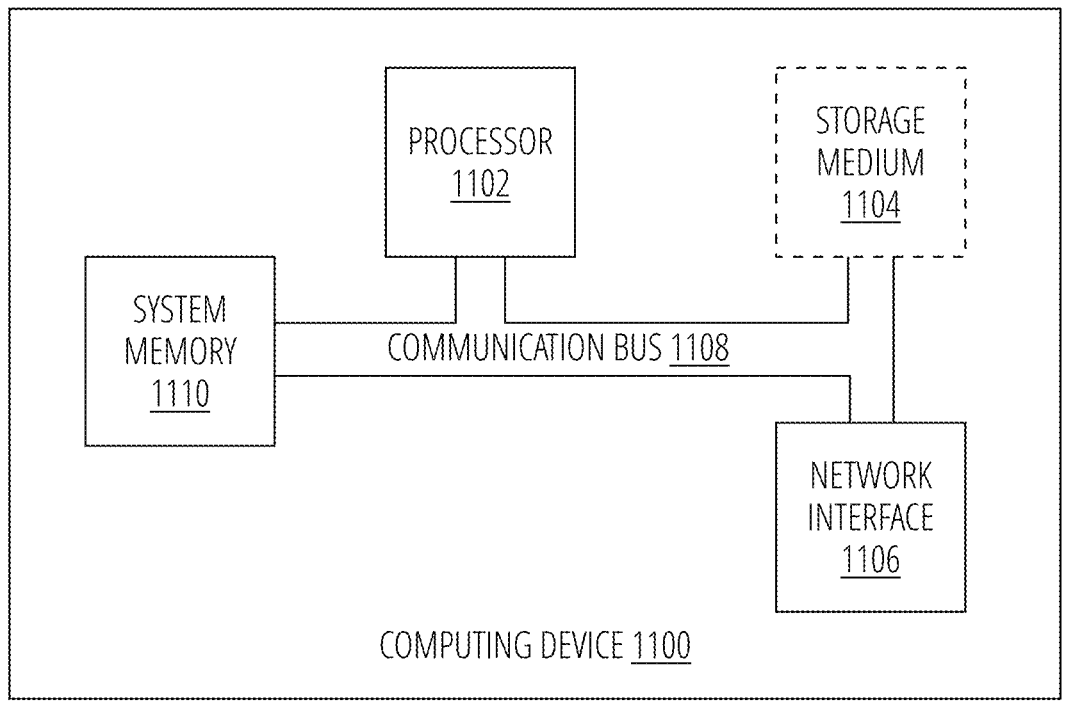
FIG. 11 is a block diagram that illustrates a non-limiting example embodiment of a computing device appropriate for use as a computing device with embodiments of the present disclosure.

FIG. 11 is a block diagram that illustrates aspects of an exemplary computing device 1100 appropriate for use as a computing device of the present disclosure. While multiple different types of computing devices were discussed above, the exemplary computing device 1100 describes various elements that are common to many different types of computing devices. While FIG. 11 is described with reference to a computing device that is implemented as a device on a network, the description below is applicable to servers, personal computers, mobile phones, smart phones, tablet computers, embedded computing devices, and other devices that may be used to implement portions of embodiments of the present disclosure. Some embodiments of a computing device may be implemented in or may include an application-specific integrated circuit (ASIC), a field-programmable gate array (FPGA), or other customized device. Moreover, those of ordinary skill in the art and others will recognize that the computing device 1100 may be any one of any number of currently available or yet to be developed devices.

In its most basic configuration, the computing device 1100 includes at least one processor 1102 and a system memory 1110 connected by a communication bus 1108. Depending on the exact configuration and type of device, the system memory 1110 may be volatile or nonvolatile memory, such as read only memory ("ROM"), random access memory ("RAM"), EEPROM, flash memory, or similar memory technology. Those of ordinary skill in the art and others will recognize that system memory 1110 typically stores data and/or program modules that are immediately accessible to and/or currently being operated on by the processor 1102. In this regard, the processor 1102 may serve as a computational center of the computing device 1100 by supporting the execution of instructions.

As further illustrated in FIG. 11, the computing device 1100 may include a network interface 1106 comprising one or more components for communicating with other devices over a network. Embodiments of the present disclosure may access basic services that utilize the network interface 1106 to perform communications using common network protocols. The network interface 1106 may also include a wireless network interface configured to communicate via one or more wireless communication protocols, such as Wi-Fi, 2G, 3G, LTE, WiMAX, Bluetooth, Bluetooth low energy, and/or the like. As will be appreciated by one of ordinary skill in the art, the network interface 1106 illustrated in FIG. 11 may represent one or more wireless interfaces or physical communication interfaces described and illustrated above with respect to particular components of the computing device 1100.

In the exemplary embodiment depicted in FIG. 11, the computing device 1100 also includes a storage medium 1104. However, services may be accessed using a computing device that does not include means for persisting data to a local storage medium. Therefore, the storage medium 1104 depicted in FIG. 11 is represented with a dashed line to indicate that the storage medium 1104 is optional. In any event, the storage medium 1104 may be volatile or nonvolatile, removable or nonremovable, implemented using any technology capable of storing information such as, but not limited to, a hard drive, solid state drive, CD ROM, DVD, or other disk storage, magnetic cassettes, magnetic tape, magnetic disk storage, and/or the like.

Suitable implementations of computing devices that include a processor 1102, system memory 1110, communication bus 1108, storage medium 1104, and network interface 1106 are known and commercially available. For ease of illustration and because it is not important for an understanding of the claimed subject matter, FIG. 11 does not show some of the typical components of many computing devices. In this regard, the computing device 1100 may include input devices, such as a keyboard, keypad, mouse, microphone, touch input device, touch screen, tablet, and/or the like. Such input devices may be coupled to the computing device 1100 by wired or wireless connections including RF, infrared, serial, parallel, Bluetooth, Bluetooth low energy, USB, or other suitable connections protocols using wireless or physical connections. Similarly, the computing device 1100 may also include output devices such as a display, speakers, printer, etc. Since these devices are well known in the art, they are not illustrated or described further herein.

In the preceding description, numerous specific details are set forth to provide a thorough understanding of various embodiments of the present disclosure. One skilled in the relevant art will recognize, however, that the techniques described herein can be practiced without one or more of the specific details, or with other methods, components, materials, etc. For example, though embodiments that utilize MPI are described above, in other embodiments, other distributed-memory frameworks may be used. In some instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The order in which some or all of the blocks appear in each method flowchart should not be deemed limiting. Rather, one of ordinary skill in the art having the benefit of the present disclosure will understand that actions associated with some of the blocks may be executed in a variety of orders not illustrated, or even in parallel.

The processes explained above are described in terms of computer software and hardware. The techniques described may constitute machine-executable instructions embodied within a tangible or non-transitory machine (e.g., computer) readable storage medium, that when executed by a machine will cause the machine to perform the operations described. Additionally, the processes may be embodied within hardware, such as an application specific integrated circuit ("ASIC") or otherwise.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A non-transitory computer-readable medium having logic stored thereon that, in response to execution by one or more processors of a computing device, cause the computing device to perform actions for optimal parallel execution of a simulation of a design, the actions comprising:
    extracting, by the computing device, one or more features from the design;
    providing, by the computing device, at least the one or more features as inputs to one or more machine learning models to determine one or more predictions of execution times;
    determining, by the computing device, an optimum execution architecture based on the one or more predictions of execution times; and
    distributing, by the computing device, portions of the design for simulation based on the optimum execution architecture.

2. The non-transitory computer-readable medium of claim 1, wherein extracting the one or more features from the design includes determining a number of segment types for the design and a total number of segments for the design.

3. The non-transitory computer-readable medium of claim 1, wherein providing at least the one or more features as inputs to the one or more machine learning models to determine the one or more predictions of execution times includes:
    providing at least one proposed number of processing elements as an input to the one or more machine learning models.

4. The non-transitory computer-readable medium of claim 3, wherein providing at least the one or more features as input to the one or more machine learning models to determine the one or more predictions of execution times includes:
    providing the one or more features and the proposed number of processing elements to a first machine learning model model that generates output for predicting computation time; and
    providing the one or more features and the proposed number of processing elements to a second machine learning model that generates output for predicting communication time.

5. The non-transitory computer-readable medium of claim 4, wherein the actions further comprise:
    determining a predicted computation time by multiplying the output of the first machine learning model by a total number of segments for the design and dividing by the proposed number of processing elements.

6. The non-transitory computer-readable medium of claim 4, wherein the actions further comprise:
    determining a predicted communication time by multiplying the output of the second machine learning model by a maximum surface area of a portion of the design to be provided to a processing element for simulation.

7. The non-transitory computer-readable medium of claim 3, wherein determining the optimum execution architecture based on the one or more predictions of execution times includes:
    providing different proposed numbers of processing elements as an input to the one or more machine learning models; and determining a performance plateau based on the outputs of the one or more machine learning models for the different proposed numbers of processing elements.

8. The non-transitory computer-readable medium of claim 1, wherein distributing portions of the design for simulation based on the optimum execution architecture includes:
instantiating a number of processing elements based on the optimum execution architecture; and
distributing portions of the design to the instantiated processing elements for simulation.

9. A method for optimal parallel execution of a simulation of a design, the method comprising:
extracting, by a computing device, one or more features from the design;
providing, by the computing device, at least the one or more features as inputs to one or more machine learning models to determine one or more predictions of execution times;
determining, by the computing device, an optimum execution architecture based on the one or more predictions of execution times; and
distributing, by the computing device, portions of the design for simulation based on the optimum execution architecture.

10. The method of claim 9, wherein extracting the one or more features from the design includes determining a number of segment types for the design and a total number of segments for the design.

11. The method of claim 9, wherein providing at least the one or more features as inputs to the one or more machine learning models to determine the one or more predictions of execution times includes:
providing at least one proposed number of processing elements as an input to the one or more machine learning models.

12. The method of claim 11, wherein providing at least the one or more features as input to the one or more machine learning models to determine the one or more predictions of execution times includes:
providing the one or more features and the proposed number of processing elements to a first machine learning model that generates output for predicting computation time; and
providing the one or more features and the proposed number of processing elements to a second machine learning model that generates output for predicting communication time.

13. The method of claim 12, wherein the actions further comprise:
determining a predicted computation time by multiplying the output of the first machine learning model by a total number of segments for the design and dividing by the proposed number of processing elements.

14. The method of claim 12, wherein the actions further comprise:
determining a predicted communication time by multiplying the output of the second machine learning model by a maximum surface area of a portion of the design to be provided to a processing element for simulation.

15. The method of claim 11, wherein determining the optimum execution architecture based on the one or more predictions of execution times includes:
providing different proposed numbers of processing elements as an input to the one or more machine learning models; and determining a performance plateau based on the outputs of the one or more machine learning models for the different proposed numbers of processing elements.

16. The method of claim 9, wherein distributing portions of the design for simulation based on the optimum execution architecture includes:
instantiating a number of processing elements based on the optimum execution architecture; and
distributing portions of the design to the instantiated processing elements for simulation.

17. A non-transitory computer-readable medium having logic stored thereon that, in response to execution by one or more processors of a computing device, cause the computing device to perform actions for training a machine learning model to generate outputs for predicting an optimal parallel execution architecture for simulation of a design, the actions comprising:
determining, by the computing device, a set of sample designs;
causing, by the computing device, each sample design to be simulated using at least one hardware configuration;
determining, by the computing device, a set of features for each simulation, wherein the set of features for each simulation includes a number of segment types of the sample design in the simulation, a total number of segments of the sample design in the simulation, and a characteristic of the hardware configuration of the simulation;
training, by the computing device, at least one machine learning model using the features for each simulation and the measured performance of each simulation as training data; and
storing, by the computing device, the at least one machine learning model in a model data store.

18. The non-transitory computer-readable medium of claim 17, wherein causing each sample design to be simulated using at least one hardware configuration includes:
for a given sample design, causing a first simulation of the given sample design to be executed using a first hardware configuration and causing a second simulation of the given sample design to be executed using a second hardware configuration.

19. The non-transitory computer-readable medium of claim 18, wherein the characteristic of the hardware configuration is a number of processing elements, wherein the number of processing elements for the first hardware configuration is a first number of processing elements, wherein the number of processing elements for the second hardware configuration is a second number of processing elements, and wherein training the at least one machine learning model using the features for each simulation and the measured performance of each simulation as training data includes:
using the features for the given sample design as a first training data set, and using the measured performance of the first simulation as a label for the first training data set; and
using the features for the given sample design as a second training data set, and using the measured performance of the second simulation as a label for the second training data set.

20. The non-transitory computer-readable medium of claim 17, wherein training at least one machine learning model using the features for each simulation and the measured performance of each simulation as training data includes:
training a first artificial neural network to generate a value usable to predict computation time; and training a second artificial neural network to generate a value usable to predict communication time.

* * * * *